United States Patent
Chon et al.

(10) Patent No.: US 9,909,007 B2
(45) Date of Patent: Mar. 6, 2018

(54) CURABLE SILICONE COMPOSITION, CURED PRODUCT THEREOF, AND OPTICAL SEMICONDUCTOR DEVICE

(71) Applicants: Dow Corning Corporation, Midland, MI (US); Dow Corning Toray Co., Ltd., Tokyo (JP)

(72) Inventors: Jina Chon, Gwanghewon-Myeon (KR); Akito Hayashi, Ichihara (JP); Maki Itoh, Ichihara (JP); Gunn Jo, Gwanghewon-Myeon (KR); Min-Hee Kwon, Gwanghewon-Myeon (KR)

(73) Assignees: DOW CORNING CORPORATION, Midland, MI (US); DOW CORNING TORAY CO. LTD., Tokyo (JP)

( * ) Notice: Subject to any disclaimer, the term of this patent is extended or adjusted under 35 U.S.C. 154(b) by 0 days.

(21) Appl. No.: 14/914,137

(22) PCT Filed: Aug. 26, 2014

(86) PCT No.: PCT/JP2014/072857
§ 371 (c)(1),
(2) Date: Feb. 24, 2016

(87) PCT Pub. No.: WO2015/030224
PCT Pub. Date: Mar. 5, 2015

(65) Prior Publication Data
US 2016/0215141 A1   Jul. 28, 2016

Related U.S. Application Data

(60) Provisional application No. 61/871,358, filed on Aug. 29, 2013, provisional application No. 61/936,008, filed on Feb. 5, 2014.

(51) Int. Cl.
| | |
|---|---|
| *C08L 83/04* | (2006.01) |
| *H01L 23/29* | (2006.01) |
| *H01L 33/56* | (2010.01) |
| *C08K 5/00* | (2006.01) |
| *H01L 33/62* | (2010.01) |
| *C08G 77/12* | (2006.01) |
| *C08G 77/20* | (2006.01) |
| *C08G 77/00* | (2006.01) |

(52) U.S. Cl.
CPC ............ *C08L 83/04* (2013.01); *C08K 5/0025* (2013.01); *H01L 23/296* (2013.01); *H01L 33/56* (2013.01); *H01L 33/62* (2013.01); *C08G 77/12* (2013.01); *C08G 77/20* (2013.01); *C08G 77/80* (2013.01); *H01L 2224/32245* (2013.01); *H01L 2224/48091* (2013.01); *H01L 2224/48247* (2013.01); *H01L 2224/73265* (2013.01); *H01L 2924/181* (2013.01)

(58) Field of Classification Search
CPC ............... H01L 23/296; C08G 77/80

USPC .................... 257/788, 791; 528/43
See application file for complete search history.

(56) References Cited

U.S. PATENT DOCUMENTS

| | | | |
|---|---|---|---|
| 7,282,270 B2 | 10/2007 | Morita et al. | |
| 7,527,871 B2 | 5/2009 | Morita et al. | |
| 8,080,614 B2 | 12/2011 | Morita et al. | |
| 8,299,186 B2 | 10/2012 | Sagawa et al. | |
| 2007/0112147 A1 | 5/2007 | Morita et al. | |
| 2009/0179180 A1 | 7/2009 | Morita et al. | |
| 2011/0160410 A1 | 6/2011 | Sagawa et al. | |
| 2014/0031509 A1* | 1/2014 | Ko | C08L 83/14 528/31 |
| 2014/0088251 A1* | 3/2014 | Ko | H01L 23/296 524/862 |

FOREIGN PATENT DOCUMENTS

| | | | |
|---|---|---|---|
| AT | | 451426 T | 12/2009 |
| AT | | 463537 T | 4/2010 |
| CN | | 1863875 A | 11/2006 |
| CN | | 101466795 A | 6/2009 |
| CN | | 102066493 A | 5/2011 |
| DE | 60 2007 003 724 | D1 | 1/2010 |
| DE | 60 2004 026 456 | D1 | 5/2010 |
| EP | | 2 032 653 B1 | 12/2009 |
| EP | | 1 670 863 B1 | 4/2010 |
| EP | | 2 326 686 B1 | 8/2012 |
| EP | | 2 530 123 A2 | 12/2012 |

(Continued)

OTHER PUBLICATIONS

International Search Report for Application No. PCT/JP2014/072857 dated Sep. 22, 2014, 3 pages.

(Continued)

*Primary Examiner* — Marc Zimmer
(74) *Attorney, Agent, or Firm* — Howard & Howard Attorneys PLLC

(57) ABSTRACT

The present invention relates to a curable silicone composition comprising: (A) an organopolysiloxane represented by the average unit formula: $(R^1{}_3SiO_{1/2})_a(R^1{}_2SiO_{2/2})_b(R^2SiO_{3/2})_c(R^3SiO_{3/2})_d$, wherein, $R^1$ are the same or different alkyl groups having from 1 to 12 carbons, alkenyl groups having from 2 to 12 carbons, aryl groups having from 6 to 20 carbons, or aralkyl groups having from 7 to 20 carbons, provided that at least two $R^1$ in a molecule are the alkenyl groups; $R^2$ is an aryl group having from 6 to 20 carbons or an aralkyl group having from 7 to 20 carbons; $R^3$ is an alkyl group having from 1 to 12 carbons; and a, b, c, and d are respectively numbers satisfying: $0.01 \leq a \leq 0.5$, $0 \leq b \leq 0.7$, $0.01 \leq c < 0.7$, $0.1 \leq d < 0.9$, and $a+b+c+d=1$; (B) a linear organopolysiloxane having at least two silicon-bonded alkenyl groups and at least one silicon-bonded aryl group in a molecule; (C) an organopolysiloxane having at least two silicon-bonded hydrogen atoms in a molecule; (D) a hydrosilylation-reaction catalyst. The curable silicone composition has excellent handling/workability and forming a cured product with a high refractive index and low gas permeability when cured.

14 Claims, 1 Drawing Sheet

(56) References Cited

FOREIGN PATENT DOCUMENTS

| | | | |
|---|---|---|---|
| JP | 2004-143361 A | 5/2004 | |
| JP | 2005-105217 A | 4/2005 | |
| JP | 2008-001828 A | 1/2008 | |
| JP | 2010-001335 A | 1/2010 | |
| JP | 2012-059868 A | 3/2012 | |
| KR | 2006-0096429 A | 9/2006 | |
| KR | 2009-0028720 A | 3/2009 | |
| KR | 2011-0018916 A | 2/2011 | |
| MY | 147862 A | 1/2013 | |
| RU | 2010-151565 A | 7/2012 | |
| TW | 2008-08908 A | 2/2008 | |
| TW | 2010-00561 A | 1/2010 | |
| TW | 341857 B | 5/2011 | |
| WO | 2005/033207 A1 | 4/2005 | |
| WO | 2007/148812 A1 | 12/2007 | |
| WO | 2009/154260 A1 | 12/2009 | |
| WO | WO 2010/027105 | * | 3/2010 |
| WO | WO 2013/077702 | * | 5/2013 |

OTHER PUBLICATIONS

English language abstract and original document not found for AT 451426; however, see English language equivalent U.S. Pat. No. 8,080,614 extracted from espacenet.com database on Mar. 3, 2016.
English language abstract and original document not found for AT 463537; however, see English language equivalent U.S. Pat. No. 7,527,871 extracted from espacenet.com database on Mar. 3, 2016.
English language abstract for CN 1863875 extracted from espacenet.com database database on Mar. 3, 2016, 2 pages.
English language abstract for CN 101466795 extracted from espacenet.com database on Mar. 3, 2016, 2 pages.
English language abstract for CN 102066493 extracted from espacenet.com database on Mar. 3, 2016, 2 pages.
English language abstract and original document not found for DE 60 2007 003 724; however, see English language equivalent U.S. Pat. No. 8,080,614 extracted from espacenet.com database on Mar. 3, 2016.
English language abstract and original document not found for DE 60 2004 026 456; however, see English language equivalent U.S. Pat. No. 7,527,871 extracted from espacenet.com database on Mar. 3, 2016.
English language abstract for JP 2004-143361 extracted from espacenet.com database on Mar. 3, 2016, 2 pages.
English language abstract for JP 2005-105217 extracted from espacenet.com database on Mar. 3, 2016, 2 pages.
English language abstract for JP 2008-001828 extracted from espacenet.com database on Mar. 3, 2016, 2 pages.
English language abstract for JP 2010-001335 extracted from espacenet.com database on Mar. 3, 2016, 2 pages.
English language abstract and machine-assisted English translation for JP 2012-059868 extracted from espacenet.com database on Mar. 3, 2016, 56 pages.
English language abstract for KR 2006-0096429 extracted from espacenet.com database on Mar. 3, 2016, 2 pages.
English language abstract for KR 2009-0028720 extracted from espacenet.com database on Mar. 3, 2016, 2 pages.
English language abstract for KR 2011-0018916 extracted from espacenet.com database on Mar. 3, 2016, 2 pages.
English language abstract for MY 147862 extracted from espacenet.com database on Mar. 3, 2016, 2 pages.
English language abstract for RU 2010-151565 extracted from espacenet.com database on Mar. 3, 2016, 2 pages.
English language abstract for TW 2008-08908 extracted from espacenet.com database on Mar. 3, 2016, 1 page.
English language abstract for TW 2010-00561 extracted from espacenet.com database on Mar. 3, 2016, 2 pages.
English language abstract for TWI 341857 extracted from espacenet.com database on Mar. 3, 2016, 2 pages.

* cited by examiner

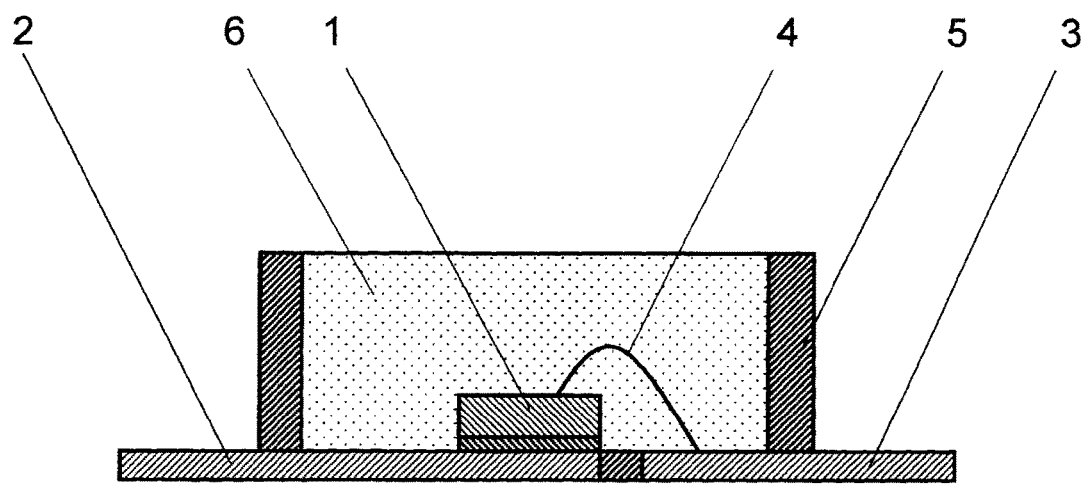

CURABLE SILICONE COMPOSITION, CURED PRODUCT THEREOF, AND OPTICAL SEMICONDUCTOR DEVICE

RELATED APPLICATIONS

This application is the National Stage of International Patent Application No. PCT/JP2014/072857, filed on Aug. 26, 2014, which claims priority to and all the advantages of United States Provisional Patent Application No. 61/871,358, filed on Aug. 29, 2013, and United States Provisional Patent Application No. 61/936,008, filed on Feb. 5, 2014, the contents of which is incorporated herein by reference.

TECHNICAL FIELD

The present invention relates to a curable silicone composition, a cured product formed by curing the composition, and an optical semiconductor device produced using the composition.

BACKGROUND ART

Curable silicone compositions are used as sealing materials or protective coating materials for optical semiconductor elements in optical semiconductor devices such as light emitting diodes (LEDs), or the like. As such a curable silicone composition, a curable silicone composition comprising: a linear organopolysiloxane having at least two silicon-bonded alkenyl groups and at least one silicon-bonded aryl group in a molecule; an organopolysiloxane having at least one silicon-bonded alkenyl groups, at least one silicon-bonded aryl group, and a siloxane unit represented by the formula: $C_6H_5SiO_{3/2}$ in a molecule; an organopolysiloxane having at least two silicon-bonded hydrogen atoms in a molecule; and a hydrosilylation-reaction catalyst has been proposed (see Patent Document 1).

However, such a curable silicone composition has a problem in that, although a cured product having a high refractive index can be obtained, the elongation of the cured product is low. Because the cured product exhibits high gas permeability, when such a cured product is used in high brightness LEDs, which exhibit high light intensity and generate large amounts of heat, problems occur such as discoloration of a sealing material, and a reduction in brightness due to corrosion of silver plated on the LED substrate by corrosive gases.

PRIOR ART DOCUMENTS

Patent Documents

Patent Document 1: Japanese Unexamined Patent Application Publication No. 2004-143361

SUMMARY OF INVENTION

Technical Problem

An object of the present invention is to provide a curable silicone composition having excellent handling/workability and forming a cured product with a high refractive index, high transparency, low gas permeability, and excellent elongation when cured. In addition, another object of the present invention is to provide a cured product having a high refractive index, low gas permeability, and excellent elongation, and to provide an optical semiconductor device having excellent reliability.

Solution to Problem

The curable silicone composition of the present invention comprises:
(A) an organopolysiloxane represented by the average unit formula:

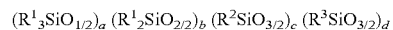

wherein, $R^1$ are the same or different alkyl groups having from 1 to 12 carbons, alkenyl groups having from 2 to 12 carbons, aryl groups having from 6 to 20 carbons, or aralkyl groups having from 7 to 20 carbons, provided that at least two $R^1$ in a molecule are the alkenyl groups; $R^2$ is an aryl group having from 6 to 20 carbons or an aralkyl group having from 7 to 20 carbons; $R^3$ is an alkyl group having from 1 to 12 carbons; and a, b, c, and d are respectively numbers satisfying: $0.01 \leq a \leq 0.5$, $0 \leq b \leq 0.7$, $0.01 \leq c < 0.7$, $0.1 \leq d < 0.9$, and $a+b+c+d=1$;
(B) a linear organopolysiloxane having at least two silicon-bonded alkenyl groups and at least one silicon-bonded aryl group in a molecule, in an amount of 0.1 to 150 parts by mass per 100 parts by mass of component (A);
(C) an organopolysiloxane having at least two silicon-bonded hydrogen atoms in a molecule, in an amount so that the amount of silicon-bonded hydrogen atoms in component (C) is from 0.1 to 5 mol per 1 mol of total alkenyl groups in components (A) and (B); and
(D) a hydrosilylation-reaction catalyst in an amount that accelerates curing of the present composition.

The cured product of the present invention is formed by curing the curable silicone composition described above.

The optical semiconductor device of the present invention is produced by sealing an optical semiconductor element with a cured product of the curable silicone composition described above.

Effects of Invention

The curable silicone composition of the present invention has excellent handling/workability and forms a cured product with a high refractive index, low gas permeability, and excellent elongation when cured. Furthermore, the cured product of the present invention is characterized by having a high refractive index and a low gas permeability, and the optical semiconductor device of the present invention is characterized by exhibiting excellent reliability.

BRIEF DESCRIPTION OF THE DRAWINGS

FIG. 1 is a cross-sectional view of an LED that is an example of an optical semiconductor device of the present invention.

DETAILED DESCRIPTION OF THE INVENTION

First, the curable silicone composition of the present invention will be described in detail.

Component (A) is a main material of the present composition and is an organopolysiloxane represented by the average unit formula:

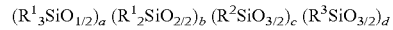

In the formula, $R^1$ may be the same or different, and are each an alkyl group having from 1 to 12 carbons, an alkenyl group having from 2 to 12 carbons, an aryl group having from 6 to 20 carbons, or an aralkyl group having from 7 to 20 carbons. Specific examples of $R^1$ include alkyl groups such as a methyl group, ethyl group, propyl group, butyl group, pentyl group, hexyl group, heptyl group, octyl group, nonyl group, decyl group, undecyl group, and dodecyl group; alkenyl groups such as a vinyl group, allyl group, butenyl group, pentenyl group, hexenyl group, heptenyl group, octenyl group, nonenyl group, decenyl group, undecenyl group, and dodecenyl group; aryl groups such as a phenyl group, tolyl group, xylyl group, naphthyl group, anthracenyl group, phenanthryl group, and pyrenyl group; aralkyl groups such as a benzyl group, phenethyl group, naphthyl ethyl group, naphthyl propyl group, anthracenyl ethyl group, phenanthryl ethyl group, and pyrenyl ethyl group; and groups obtained by substituting hydrogen atoms in these aryl groups and aralkyl groups with alkyl groups such as methyl groups or ethyl groups, alkoxy groups such as methoxy groups and ethoxy groups, and halogen atoms such as chlorine atoms and bromine atoms. However, at least two $R^1$ in a molecule are alkenyl groups and are preferably vinyl groups. In the formula, $R^2$ is an aryl group having from 6 to 20 carbons or an aralkyl group having from 7 to 20 carbons. Specific examples of $R^2$ include aryl groups such as a phenyl group, tolyl group, xylyl group, naphthyl group, anthracenyl group, phenanthryl group, and pyrenyl group; aralkyl groups such as a benzyl group, phenethyl group, naphthyl ethyl group, naphthyl propyl group, anthracenyl ethyl group, phenanthryl ethyl group, and pyrenyl ethyl group; and groups obtained by substituting hydrogen atoms in these aryl groups and aralkyl groups with alkyl groups such as methyl groups or ethyl groups, alkoxy groups such as methoxy groups and ethoxy groups, and halogen atoms such as chlorine atoms and bromine atoms. Furthermore, in the formula, $R^3$ is an alkyl group having from 1 to 12 carbons. Specific examples of $R^3$ include a methyl group, ethyl group, propyl group, butyl group, pentyl group, hexyl group, heptyl group, octyl group, nonyl group, decyl group, undecyl group, and dodecyl group; and a methyl group is preferable.

Furthermore, in the formula, a, b, c, and d are numbers that each satisfy: $0.01 \leq a \leq 0.5$, $0 \leq b \leq 0.7$, $0.01 \leq c < 0.7$, $0.1 \leq d < 0.9$, and $a+b+c+d=1$; preferably a, b, c, and d are numbers that each satisfy: $0.05 \leq a \leq 0.45$, $0 \leq b \leq 0.5$, $0.01 \leq c < 0.6$, $0.2 \leq d < 0.9$, and $a+b+c+d=1$; or a, b, c, and d are numbers that each satisfy: $0.05 \leq a \leq 0.4$, $0 \leq b \leq 0.4$, $0.02 \leq c < 0.5$, $0.3 \leq d < 0.9$, and $a+b+c+d=1$. This is because the cured product will be hardly sticky when a is greater than or equal to the lower limit of the range described above, and, on the other hand, the strength of the cured product will be favorable when a is less than or equal to the upper limit of the range described above. This is also because the hardness of the cured product will be favorable and the mechanical properties of the cured product will be enhanced when b is less than or equal to the upper limit of the range described above. This is also because the gas barrier properties and the refractive index of the cured product will be favorable when c is greater than or equal to the lower limit of the range described above, and, on the other hand, the mechanical properties of the cured product will be enhanced when c is less than or equal to the upper limit of the range described above. This is because the elongation of the cured product will be enhanced when d is greater than or equal to the lower limit of the range described above, and, on the other hand, gas barrier properties will be enhanced when d is less than or equal to the upper limit of the range described above.

Component (A) is represented by the average unit formula described above but may also have siloxane units represented by the formula: $SiO_{4/2}$ within a range that does not impair the object of the present invention. Furthermore, component (A) may contain silicon-bonded alkoxy groups, such as a methoxy group, ethoxy group, and propoxy group, or silicon-bonded hydroxyl groups within a range that does not impair the object of the present invention.

The method of preparing this type of component (A) is exemplified by a method of hydrolyzing and condensation-reacting a silane compound (I) represented by the general formula:

$$R^2SiX_3$$

a silane compound (II) represented by the general formula:

$$R^3SiX_3$$

a disiloxane (III) represented by the general formula:

$$R^1{}_3SiOSiR^1{}_3$$

and/or, a silane compound (IV) represented by the general formula:

$$R^1{}_3SiX$$

in the presence of an acid or base.

The silane compound (I) is a raw material for introducing siloxane units represented by the formula: $R^2SiO_{3/2}$ into the organopolysiloxane. In the formula, $R^2$ is an aryl group having from 6 to 20 carbons or an aralkyl group having from 7 to 20 carbons, examples of which are synonymous with the groups described above, and are preferably phenyl groups or naphthyl groups. Furthermore, in the formula, X are each an alkoxy group, acyloxy group, halogen atom, or hydroxyl group. Examples of the alkoxy group for X include a methoxy group, ethoxy group, and propoxy group. Examples of the acyloxy group for X include an acetoxy group. Examples of the halogen atom for X include a chlorine atom and bromine atom.

Examples of such a silane compound (I) include alkoxy silanes such as phenyl trimethoxysilane, naphthyl trimethoxysilane, anthracenyl trimethoxysilane, phenanthryl trimethoxysilane, pyrenyl trimethoxysilane, phenyl triethoxysilane, naphthyl triethoxysilane, anthracenyl triethoxysilane, phenanthryl triethoxysilane, and pyrenyl triethoxysilane; acyloxysilanes such as phenyl triacetoxysilane, naphthyl triacetoxysilane, anthracenyl triacetoxysilane, phenanthryl triacetoxysilane, and pyrenyl triacetoxysilane; halosilanes such as phenyl trichlorosilane, naphthyl trichlorosilane, anthracenyl trichlorosilane, phenanthryl trichlorosilane, and pyrenyl trichlorosilane; and hydroxysilanes such as phenyl trihydroxysilane, naphthyl trihydroxysilane, anthracenyl trihydroxysilane, phenanthryl trihydroxysilane, and pyrenyl trihydroxysilane; and a mixture of two or more types of these.

The silane compound (II) is a raw material for introducing siloxane units represented by the formula: $R^3SiO_{3/2}$ into the organopolysiloxane. In the formula, $R^3$ is an alkyl group having from 1 to 12 carbons, examples of which are synonymous with the groups described above, and are preferably a methyl group, ethyl group, or propyl group. Moreover, in the formula, X are each an alkoxy group, acyloxy group, halogen atom, or hydroxyl group; and examples thereof are the same as the groups described above.

Examples of such a silane compound (II) include alkoxysilanes such as methyl trimethoxysilane, ethyl trimethoxysilane, propyl trimethoxysilane, butyl trimethoxysilane, isobutyl trimethoxysilane, methyl triethoxysilane, ethyl triethoxysilane, propyl triethoxysilane, butyl triethoxysilane, and isobutyl triethoxysilane; acyloxysilanes such as methyl triacetoxysilane, ethyl triacetoxysilane, propyl triacetoxysilane, butyl triacetoxysilane, and isobutyl triacetoxysilane; halosilanes such as methyl trichlorosilane, ethyl trichlorosilane, propyl trichlorosilane, butyl trichlorosilane, and isobutyl trichlorosilane; hydroxysilanes such as methyl trihydroxysilane, ethyl trihydroxysilane, propyl trihydroxysilane, butyl trihydroxysilane, and isobutyl trihydroxysilane; and a mixture of two or more types of these.

The disiloxane (III) is a raw material for introducing siloxane units represented by the formula: $R^1_3SiO_{1/2}$ into the organopolysiloxane. In the formula, $R^1$ may be the same or different and are each an alkyl group having from 1 to 12 carbons, an alkenyl group having from 2 to 12 carbons, an aryl group having from 6 to 20 carbons, or an aralkyl group having from 7 to 20 carbons, and examples thereof are the same as the groups described above.

Examples of such a disiloxane (III) include 1,1,1,3,3,3-hexamethyldisiloxane, 1,3-diphenyl-1,1,3,3-tetramethyldisiloxane, 1,3-divinyl-1,1,3,3-tetramethyldisiloxane, 1,3-divinyl-1,3-diphenyl-1,3-dimethyldisiloxane, 1,3-divinyl-1,1,3,3-tetraethyldisiloxane, 1,1,3,3-tetravinyl-1,3-dimethyldisiloxane, and 1,1,1,3,3,3-hexavinyldisiloxane, and a mixture of two or more types of these.

The silane compound (IV) is, as same as the disiloxane (III), a raw material for introducing siloxane units represented by the formula: $R^1_3SiO_{1/2}$ into the organopolysiloxane. In the formula, $R^1$ may be the same or different and are each an alkyl group having from 1 to 12 carbons, an alkenyl group having from 2 to 12 carbons, an aryl group having from 6 to 20 carbons, or an aralkyl group having from 7 to 20 carbons, and examples thereof are the same as the groups described above. Moreover, in the formula, X is an alkoxy group, an acyloxy group, a halogen atom, or a hydroxyl group; and examples thereof are the same as the groups described above.

Examples of such a silane compound (IV) include alkoxysilanes such as trimethylmethoxysilane, dimethylphenylmethoxysilane, dimethylvinylmethoxysilane, methylphenylvinylmethoxysilane, diethylvinylmethoxysilane, trimethylethoxysilane, dimethylvinylethoxysilane, diethylvinylethoxysilane, divinylmethylmethoxysilane, and trivinylmethoxysilane; acyloxysilanes such as trimethylacetoxysilane, dimethylphenylacetoxysilane, dimethylvinylacetoxysilane, methylphenylvinylacetoxysilane, diethylvinylacetoxysilane, divinylmethylacetoxysilane, and trivinylacetoxysilane; halosilanes such as trimethylchlorosilane, dimethylphenylchlorosilane, dimethylvinylchlorosilane, methylphenylvinylchlorosilane, diethylvinylchlorosilane, divinylmethylchlorosilane, and trivinylchlorosilane; hydroxysilanes such as trimethylhydroxysilane, dimethylphenylhydroxysilane, dimethylvinylhydroxysilane, methylphenylvinylhydroxysilane, diethylvinylhydroxysilane, divinylmethylhydroxysilane, and trivinylhydroxysilane; and a mixture of two or more types of these.

In the preparation method described above, a silane compound (V) or cyclic silicone compound (VI) for introducing siloxane units represented by the formula: $R^1_2SiO_{2/2}$ or a silane compound or silane oligomer for introducing siloxane units represented by the formula: $SiO_{4/2}$ may be reacted with the organopolysiloxane as necessary. In the formula, $R^1$ may be the same or different and are each an alkyl group having from 1 to 12 carbons, an alkenyl group having from 2 to 12 carbons, an aryl group having from 6 to 20 carbons, or an aralkyl group having from 7 to 20 carbons, and examples thereof are the same as the groups described above.

Examples of such a silane compound include alkoxysilanes such as dimethyldimethoxysilane, methylethyldimethoxysilane, methylvinyldimethoxysilane, methylphenyldimethoxysilane, diphenyldimethoxysilane, tetramethoxysilane, dimethyldiethoxysilane, methylethyldiethoxysilane, methylvinyldiethoxysilane, methylphenyldiethoxysilane, diphenyldiethoxysilane, and tetraethoxysilane; acetoxysilanes such as dimethyldiacetoxysilane, methylvinyldiacetoxysilane, methylphenyldiacetoxysilane, diphenyldiacetoxysilane, and tetraacetoxysilane; halosilanes such as dimethyldichlorosilane, methylvinyldichlorosilane, methylphenyldichlorosilane, diphenyldichlorosilane, and tetrachlorosilane; and hydroxysilanes such as dimethyldihydroxysilane, methylvinyldihydroxysilane, methylphenyldihydroxysilane, and diphenyldihydroxysilane. Examples of such a cyclic silicone compound include cyclic dimethylsiloxane oligomers, cyclic methylvinylsiloxane oligomers, cyclic phenylmethylsiloxane oligomers, and cyclic diphenylsiloxane oligomers. Furthermore, examples of silane oligomers include partial hydrolysates of tetramethoxysilane and partial hydrolysates of tetraethoxysilane.

The preparation method described above is characterized in that the silane compound (I), the silane compound (II), and the disiloxane (III) and/or the silane compound (IV) as well as above-described another silane compound (V), the cyclic silicone compound (VI), or silane oligomers, if necessary, are hydrolyzed/condensation-reacted in the presence of an acid or an alkali. Note that, in the preparation method described above, the disiloxane (III) and/or the silane compound (IV), or the silane compound (V) and/or the cyclic silicone compound (VI) is(are) required to be a compound(s) at least containing an alkenyl group having from 2 to 12 carbons.

Examples of the acid described above include hydrochloric acid, acetic acid, formic acid, nitric acid, oxalic acid, sulfuric acid, phosphoric acid, polyphosphoric acid, polycarboxylic acid, trifluoromethane sulfonic acid, and ion exchange resins. Furthermore, examples of the alkali described above include inorganic alkalis such as potassium hydroxide and sodium hydroxide; and organic basic compounds such as triethylamine, diethylamine, monoethanolamine, diethanolamine, triethanolamine, ammonia water, tetramethylammonium hydroxide, alkoxysilanes having an amino group; and aminopropyltrimethoxysilane.

Furthermore, an organic solvent may be used in the preparation method described above. Examples of the utilized organic solvent include ethers, ketones, acetates, aromatic or aliphatic hydrocarbons, and a γ-butyrolactone; and mixtures of two or more types of such solvents. Examples of preferred organic solvents include propylene glycol monomethyl ether, propylene glycol monomethyl ether acetate, propylene glycol monoethyl ether, propylene glycol monopropyl ether, propylene glycol monobutyl ether, propylene glycol mono-t-butyl ether, γ-butyrolactone, toluene, and xylene.

In order to accelerate the hydrolysis and condensation reaction of each of the components in the preparation method, water or a mixed solution of water and alcohol is preferably added. Methanol and ethanol are preferred examples of the alcohol. If an organic solvent is used and this reaction is accelerated by heating, the reaction is preferably performed at the reflux temperature of the organic solvent.

Component (A) may be obtained by blending individually prepared organopolysiloxanes. In such cases, each organopolysiloxane need not correspond to the average unit formula specified above, and the mixture thereof may satisfy the above-mentioned average unit formula.

Component (B) is a component for imparting flexibility to the cured product obtained by curing the present composition, and is a linear organopolysiloxane having at least two silicon-bonded alkenyl groups and at least one silicon-bonded aryl group in a molecule. Examples of the alkenyl groups in component (B) include vinyl groups, allyl groups, butenyl groups, pentenyl groups, and hexenyl groups. Of these, vinyl groups are preferable. Furthermore, examples of the aryl group in component (B) include a phenyl group, tolyl group, xylyl group, and naphthyl group. Of these, a phenyl group is preferable. Furthermore, examples of a group bonding to silicon atoms other than the alkenyl groups and aryl group in component (B) include alkyl groups such as a methyl group, ethyl group, propyl group, butyl group, pentyl group, hexyl group, and heptyl group; aralkyl groups such as a benzyl group and phenethyl group; halogenated alkyl groups such as a chloromethyl group, 3-chloropropyl group, and 3,3,3-trifluoropropyl group. Of these, a methyl group is preferable. The viscosity of component (B) is not particularly limited, and the viscosity at 25° C. is preferably in a range of 10 to 10,000,000 mPa·s, in a range of 10 to 1,000,000 mPa·s, or in a range of 10 to 100,000 mPa·s. This is because the mechanical strength of the obtained cured product tends to decrease when the viscosity of component (B) is less than the lower limit of the range described above, and, on the other hand, the handling/workability of the obtained composition tends to decrease when the viscosity of component (B) exceeds the upper limit of the range described above.

The molecular structure of component (B) is linear, and examples of such a component (B) include organopolysiloxanes represented by the general formula:

[Formula 1]

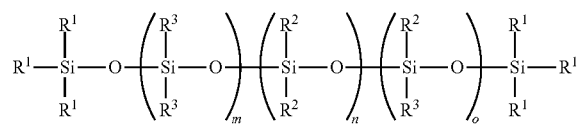

In the formula, $R^1$ are the same or different and are each an alkyl group having from 1 to 12 carbons, an alkenyl group having from 2 to 12 carbons, an aryl group having from 6 to 20 carbons, or an aralkyl group having from 7 to 20 carbons, and examples thereof are the same as the groups described above. However, at least two $R^1$ in a molecule are the alkenyl groups. Furthermore, in the formula, $R^2$ are the same or different and are each an aryl group having from 6 to 20 carbons or an aralkyl group having from 7 to 20 carbons, examples of which are synonymous with the groups described above, and are preferably phenyl groups. Furthermore, in the formula, $R^3$ are the same or different and are each an alkyl group having from 1 to 12 carbons, examples of which are synonymous with the groups described above, and are preferably methyl groups.

Furthermore, in the formula, m is an integer from 0 to 800, n is an integer from 0 to 300, and o is an integer from 0 to 300, provided that m, n, and o satisfy: m≥n and 5≤m+n+o≤1,000. Preferably, m is an integer from 0 to 500, n is an integer from 0 to 200, and o is an integer from 0 to 200, provided that m, n, and o satisfy: m≥n and 5≤m+n+o≤500. This is because the handling/workability of the composition will be enhanced when the m, n, and o are less than or equal to the upper limit of the range described above. This is also because flexibility can be imparted to the cured product when the m+n+o is within the range described above.

Component (B) is represented by the general formula described above but may also have silicon-bonded alkoxy groups such as a methoxy group, ethoxy group, or propoxy group or silicon-bonded hydroxyl groups within a range that does not impair the object of the present invention.

Examples of this type of component (B) include organopolysiloxanes such as those mentioned below. Note that, in the formulas, Me represents a methyl group, Vi represents a vinyl group, and Ph represents a phenyl group, and m' is an integer from 1 to 100, n' is an integer from 1 to 50, and o' is an integer from 1 to 50, provided that m'≥n' and m'+n'+o'≤100.

ViMe$_2$SiO(Me$_2$SiO)$_m$SiMe$_2$Vi

ViPhMeSiO(Me$_2$SiO)$_m$SiMePhVi

ViPh$_2$SiO(Me$_2$SiO)$_m$SiPh$_2$Vi

ViMe$_2$SiO(Me$_2$SiO)$_m$(Ph$_2$SiO)$_n$SiMe$_2$Vi

ViPhMeSiO(Me$_2$SiO)$_m$(Ph$_2$SiO)$_n$SiPhMeVi

ViPh$_2$SiO(Me$_2$SiO)$_m$(Ph$_2$SiO)$_n$SiPh$_2$Vi

ViMe$_2$SiO(MePhSiO)$_O$SiMe$_2$Vi

MePhViSiO(MePhSiO)$_O$SiMePhVi

Ph$_2$ViSiO(MePhSiO)$_n$SiPh$_2$Vi

ViMe$_2$SiO(Ph$_2$SiO)$_n$(PhMeSiO)$_O$SiMe$_2$Vi

ViPhMeSiO(Ph$_2$SiO)$_n$(PhMeSiO)$_O$SiPhMeVi

ViPh$_2$SiO(Ph$_2$SiO)$_n$(PhMeSiO)$_O$SiPh$_2$Vi

The content of component (B) is in a range of 0.1 to 150 parts by mass, preferably in a range of 1 to 100 parts by mass, and further preferably in a range of 1 to 75 parts by mass per 100 parts by mass of component (A). This is because, when the content of component (B) is greater than or equal to the lower limit of the range described above, it is possible to impart the cured product with flexibility, and when the content is less than or equal to the upper limit of the range described above, the mechanical properties of the cured product are favorable.

Component (C) is a crosslinking agent of the present composition and is an organopolysiloxane having at least two silicon-bonded hydrogen atoms in a molecule. Examples of the molecular structure of component (C) include linear, partially branched linear, branched chain, cyclic, and dendritic. Of these, linear, partially branched linear, and dendritic are preferable. A bonding position of the silicon-bonded hydrogen atoms in component (C) is not particularly limited, and, for example, may be at the end of a molecular chain and/or at a side chain of the molecular chain. Furthermore, examples of a group bonded to silicon atoms other than hydrogen atoms in component (C) include alkyl groups such as a methyl group, ethyl group, and propyl group; aryl groups such as a phenyl group, tolyl group, and xylyl group; aralkyl groups such as a benzyl group and phenethyl group; halogenated alkyl groups such as a 3-chloropropyl group and 3,3,3-trifluoropropyl group; glycidoxyalkyl groups such as a 3-glycidoxypropyl group and 4-glycidoxybutyl group; and alkoxysilylalkyl groups such as a trimethoxysilylethyl group, trimethoxysilylpropyl group, triethoxysilylethyl group, and dimethoxymethylsilylethyl group. Of these, a methyl group and phenyl group are preferable. The viscosity of component (C) is not particularly limited, and the viscosity at 25° C. is preferably in a range of 1 to 10,000 mPa·s, and particularly preferably in a range of 1 to 1,000 mPa·s.

Examples of such an organopolysiloxane of component (C) include 1,1,3,3-tetramethyldisiloxane, 1,3,5,7-tetramethylcyclotetrasiloxane, tris(dimethylhydrogensiloxy)methylsilane, tris(dimethylhydrogensiloxy)phenylsilane, 1-(3-glycidoxypropyl)-1,3,5,7-tetramethylcyclotetrasiloxane, 1,5-di(3-glycidoxypropyl)-1,3,5,7-tetramethylcyclotetrasiloxane, 1-(3-glycidoxypropyl)-5-trimethoxysilylethyl-1,3,5,7-tetramethylcyclotetrasiloxane, methylhydrogenpolysiloxane capped at both molecular terminals with trimethylsiloxy groups, copolymers of dimethylsiloxane and methylhydrogensiloxane capped at both molecular terminals with trimethylsiloxy groups, dimethylpolysiloxane capped at both molecular terminals with dimethylhydrogensiloxy groups, copolymers of dimethylsiloxane and methylhydrogensiloxane capped at both molecular terminals with dimethylhydrogensiloxy groups, copolymers of methylhydrogensiloxane and diphenylsiloxane capped at both molecular terminals with trimethylsiloxy groups, copolymers of methylhydrogensiloxane, diphenylsiloxane, and dimethylsiloxane capped at both molecular terminals with trimethylsiloxy groups, hydrolysis/condensation reaction products of trimethoxysilane, copolymers consisting of $(CH_3)_2HSiO_{1/2}$ units and $SiO_{4/2}$ units, copolymers consisting of $(CH_3)_2HSiO_{1/2}$ units and $SiO_{4/2}$ units and $(C_6H_5)SiO_{3/2}$ units, and mixtures of two or more types of these.

As component (C), the following organosiloxanes are further exemplified. Note that, in the formulas, Me represents a methyl group, Ph represents a phenyl group, and Naph represents a naphthyl group; e, f, g, and h are numbers each satisfy: $0.1 \le e \le 0.7$, $0 < f \le 0.5$, $0 < g \le 0.7$, $0.1 \le h < 0.9$, and $e+f+g+h=1$; and p is an integer from 1 to 100, and q is an integer of 1 or greater, provided that p+q is an integer of 100 or less.

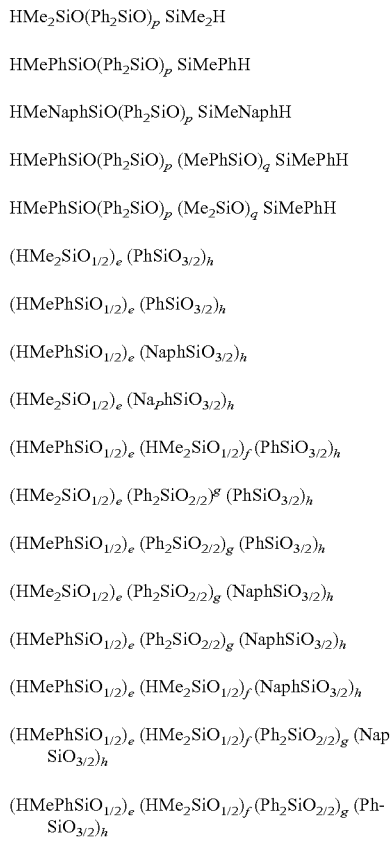

The content of component (C), per 1 mol of total alkenyl groups in components (A) and (B), is in a range such that the silicon-bonded hydrogen atoms in component (C) is in a range of 0.1 to 5 mol, and preferably in a range of 0.5 to 2 mol. This is because, when the content of component (C) is greater than or equal to the lower limit of the range described above, the composition is cured sufficiently, and when the content is less than or equal to the upper limit of the range described above, the heat resistance of the cured product improves, thus making it possible to improve the reliability of an optical semiconductor device produced using the present composition.

Component (D) is a hydrosilylation-reaction catalyst for accelerating the curing of the present composition, and examples thereof include platinum-based catalysts, rhodium-based catalysts, and palladium-based catalysts. Of these, platinum-based catalysts are preferable. Examples of this platinum-based catalyst include a platinum-based compound such as platinum fine powder, platinum black, platinum-supported silica fine powder, platinum-supported activated carbon, chloroplatinic acid, alcohol solutions of chloroplatinic acid, olefin complexes of platinum, and alkenylsiloxane complexes of platinum.

The content of component (D) is an amount that accelerates curing of the present composition, and the content of component (D) is preferably in an amount so that the amount of metal atoms in this catalyst is, in terms of mass, in a range of 0.01 to 1,000 ppm relative to the amount of the present composition. This is because curing of the obtained composition may proceed insufficiently when the content of component (D) is less than the lower limit of the range described above. On the other hand, even when the content of component (D) exceeds the upper limit of the range described above, curing of the composition will not be significantly accelerated and problems such as coloring of the cured product may arise.

Although the present composition is composed of at least components (A) to (D) described above, the present composition may also contain (E) a hydrosilylation-reaction inhibitor as an optional component for extending the working life at room temperature and improving the storage stability. Examples of such a component (E) include alkyne alcohols such as 1-ethynylcyclohexan-1-ol, 2-methyl-3-butyn-2-ol, 3,5-dimethyl-1-hexyn-3-ol, and 2-phenyl-3-butyn-2-ol; enyne compounds such as 3-methyl-3-penten-1-yne and 3,5-dimethyl-3-hexen-1-yne; methylalkenylsiloxane oligomers such as 1,3,5,7-tetramethyl-1,3,5,7-tetravinylcyclotetrasiloxane and 1,3,5,7-tetramethyl-1,3,5,7-tetrahexenylcyclotetrasiloxane; alkynoxysilanes such as dimethyl bis(3-methyl-1-butyn-3-oxy)silane and methylvinyl bis(3-methyl-1-butyn-3-oxy)silane, and triallylisocyanurate-based compounds.

The content of component (E) is not particularly limited, and the content is preferably in a range of 0.01 to 3 parts by mass, or in a range of 0.01 to 1 part by mass, per 100 parts total mass of components (A) to (C). This is because the present composition will have suitable working life when the content of component (E) is greater than or equal to the lower limit of the range described above, and, on the other hand, when the content of component (E) is less than or equal to the upper limit of the range described above, appropriate workability will be ensured.

In addition, the present composition may also contain (F) an adhesion promoter in order to further improve adhesion to the substrate with which the composition makes contact during curing. Such a component (F) is preferably an organosilicon compound having at least one alkoxy group bonded to a silicon atom in a molecule. Examples of the alkoxy group include a methoxy group, ethoxy group, propoxy group, butoxy group, and methoxyethoxy group. Of these, a methoxy group and ethoxy group are particularly preferable. Examples of groups other than alkoxy groups bonding to silicon atoms of this organosilicon compound include substituted or unsubstituted monovalent hydrocarbon groups such as alkyl groups, alkenyl groups, aryl groups, aralkyl groups, and halogenated alkyl groups; glycidoxyalkyl groups such as a 3-glycidoxypropyl group, and a 4-glycidoxybutyl group; epoxycycloalkylalkyl groups such as a 2-(3,4-epoxycyclohexyl) ethyl group, and a 3-(3,4-epoxycyclohexyl)propyl group; oxiranylalkyl groups such as a 4-oxiranylbutyl group and an 8-oxiranyloctyl group; acrylic group-containing monovalent organic groups such as 3-methacryloxypropyl groups; isocyanate groups; isocyanurate groups; and hydrogen atoms.

The organosilicon compound preferably has a group that can react with the silicon-bonded alkenyl groups or silicon-bonded hydrogen atoms in the present composition. Specifically, the organosilicon compound preferably has silicon-bonded hydrogen atoms or silicon-bonded alkenyl groups. Examples of the molecular structure of the organosilicon compound include linear, partially branched linear, branched chain, cyclic, and net-shaped structure. The molecular structure is particularly preferably linear, branched chain, or net-shaped structure. Examples of such an organosilicon compound include silane compounds such as 3-glycidoxypropyl trimethoxysilane, 2-(3,4-epoxycyclohexyl)ethyl trimethoxysilane, and 3-methacryloxypropyl trimethoxysilane; siloxane compounds having at least one of silicon-bonded alkenyl groups or silicon-bonded hydrogen atoms, and at least one silicon-bonded alkoxy group in a molecule;

mixtures of a silane compound or siloxane compound having at least one silicon-bonded alkoxy group, and a siloxane compound having at least one silicon-bonded hydroxyl group and at least one silicon-bonded alkenyl group in a molecule; siloxane compounds represented by the average unit formula:

[Formula 2]

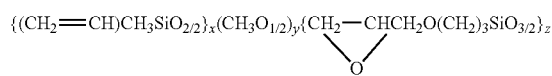

wherein, x, y, and z are positive numbers; and
siloxane compounds represented by the average unit formula:

[Formula 3]

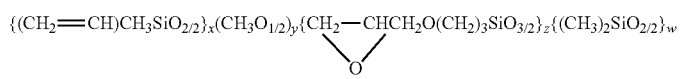

wherein, x, y, z, and w are positive numbers.

The content of component (F) is not particularly limited, and the content is preferably in a range of 0.01 to 10 parts by mass, or in a range of 0.1 to 3 parts by mass, per a total of 100 parts by mass of components (A) to (C). This is because the adhesion is favorable when the content of component (F) is greater than or equal to the lower limit of the range described above, and the storage stability is favorable when the content is less than or equal to the upper limit of the range described above.

As another optional component, the present composition may further comprise (G) a fluorescent material. Examples of such a component (G) include yellow, red, green, and blue light-emitting fluorescent substances containing oxide fluorescent substances, oxynitride fluorescent substances, nitride fluorescent substances, sulfide fluorescent substances, oxysulfide fluorescent substances, or the like, which are widely used in light-emitting diodes (LEDs), for example. Examples of oxide fluorescent substances include yttrium, aluminum, and garnet-type YAG green to yellow light-emitting fluorescent substances containing cerium ions; terbium, aluminum, and garnet-type TAG yellow light-emitting fluorescent substances containing cerium ions; and silicate green to yellow light-emitting fluorescent substances containing cerium or europium ions. Examples of oxynitride fluorescent substances include silicon, aluminum, oxygen, and nitrogen-type SiAlON red to green light-emitting fluorescent substances containing europium ions. Examples of nitride fluorescent substances include calcium, strontium, aluminum, silicon, and nitrogen-type CASN red light-emitting fluorescent substances containing europium ions. Examples of sulfide fluorescent substances include ZnS green light-emitting fluorescent substances containing copper ions or aluminum ions. Examples of oxysulfide fluorescent substances include $Y_2O_2S$ red light-emitting fluorescent substances containing europium ions. One type or a mixture of two or more types of these fluorescent materials may be used.

The average particle diameter of component (G) is not particularly limited but is preferably in a range of 1 to 50 μm, or in a range of 5 to 20 μm. This is because increases in viscosity at the time of mixing will be suppressed when the average particle diameter of component (G) is greater than or equal to the lower limit of the range described above. On the other hand, the optical transmittance will be favorable when the average particle diameter of component (G) is less than or equal to the upper limit of the range described above.

The content of component (G) is not particularly limited, and the content is preferably in an amount of 0.1 to 70 mass % relative to the amount of the present composition. Furthermore, from the perspective of handling/workability, the content of component (G) is preferably 70 mass % or less relative to the amount of the present composition. On the other hand, from the perspective of conversion properties to white light, the content of component (G) is preferably 5 mass % or greater relative to the amount of the present composition.

Such a curable silicone composition of the present invention exhibits excellent fluidity and filling properties.

Although the viscosity of the curable silicone composition is not particularly limited, depending on the application, the viscosity at 25° C. is typically preferably in a range of 100 to 500,000 mPa·s, or in a range of 100 to 100,000 mPa·s.

Moreover, an inorganic filler such as silica, glass, alumina or zinc oxide; an organic resin fine powder of a polymethacrylate resin and the like; a heat-resistant agent, a dye, a pigment, a flame retardant, a solvent and the like may be incorporated as optional components in the present composition at levels that do not impair the object of the present invention.

Of the components added as optional components, in order to sufficiently suppress the discoloration of the silver electrodes or the silver plating of the substrate in the optical semiconductor device due to sulfur-containing gas in the air, it is possible to add at least one type of a fine powder having an average particle size of 0.1 nm to 5 μm selected from the group consisting of zinc oxide fine powders surface-coated with at least one type of oxide of an element selected from the group consisting of Al, Ag, Cu, Fe, Sb, Si, Sn, Ti, Zr, and rare earth elements, zinc oxide fine powders surface-treated with organosilicon compounds not having alkenyl groups, and hydrate fine powders of zinc carbonate.

In a zinc oxide fine powder surface-coated with an oxide, examples of rare earth elements include yttrium, cerium, and europium. Examples of oxides on the surface of the zinc oxide fine powder include $Al_2O_3$, $AgO$, $Ag_2O$, $Ag_2O_3$, $CuO$, $Cu_2O$, $FeO$, $Fe_2O_3$, $Fe_3O_4$, $Sb_2O_3$, $SiO_2$, $SnO_2$, $Ti_2O_3$, $TiO_2$, $Ti_3O_5$, $ZrO_2$, $Y_2O_3$, $CeO_2$, $Eu_2O_3$, and mixtures of two or more types of these oxides.

In a zinc oxide fine powder surface-treated with an organosilicon compound, the organosilicon compound does not have alkenyl groups, and examples include organosilanes, organosilazanes, polymethylsiloxanes, organohydrogenpolysiloxanes, and organosiloxane oligomers. Specific examples include organochlorosilanes such as trimethylchlorosilane, dimethylchlorosilane, and methyltrichlorosilane; organotrialkoxysilanes such as methyltrimethoxysilane, methyltriethoxysilane, phenyltrimethoxysilane, ethyltrimethoxysilane, n-propyltrimethoxysilane, and γ-methacryloxypropyltrimethoxysilane; diorganodialkoxysilanes such as dimethyldimethoxysilane, dimethyldiethoxysilane, and diphenyldimethoxysilane; triorganoalkoxysilanes such as trimethylmethoxysilane and trimethylethoxysilane; partial condensates of these organoalkoxysilanes; organosilazanes such as hexamethyldisilazane; and a polymethylsiloxane, an organohydrogenpolysiloxane, an organosiloxane oligomer having a silanol group or an alkoxy group, resin-like organopolysiloxanes that have a silanol group or an alkoxy group and that are composed of an $R^4SiO_{3/2}$ unit (wherein, $R^4$ is a monovalent hydrocarbon group excluding alkenyl groups, and examples of the monovalent hydrocarbon group include alkyl groups such as methyl groups, ethyl groups, or propyl groups; and aryl groups such as phenyl groups), and/or an $SiO_{4/2}$ unit.

A hydrate fine powder of zinc carbonate is a compound in which water bonds to zinc carbonate, and a preferable compound is one in which the rate of weight decrease is at least 0.1 wt. % under heating conditions at 105° C. for 3 hours.

The content of the zinc oxide is an amount in a range from 1 ppm to 10% and preferably an amount in a range from 1 ppm to 5% of the composition in terms of mass units. This is because when the content of the component is greater than or equal to the lower limit of the range described above, the discoloration of the silver electrodes or the silver plating of the substrate in the optical semiconductor device due to a sulfur-containing gas is sufficiently suppressed, and when the content is less than or equal to the upper limit of the range described above, the fluidity of the resulting composition is not diminished.

In addition, the present composition may also contain a triazole-based compound as an optional component to enable the further suppression of the discoloration of the silver electrodes or the silver plating of the substrate due to a sulfur-containing gas in the air. Examples of such components include 1H-1,2,3-triazole, 2H-1,2,3-triazole, 1H-1,2,4-triazole, 4H-1,2,4-triazole, 2-(2'-hydroxy-5'-methylphenyl)benzotriazole, benzotriazole, tolyltriazole, carboxybenzotriazole, 1 H-benzotriazole-5-methylcarboxylate, 3-amino-1,2,4-triazole, 4-amino-1,2,4-triazole, 5-amino-1,2,4-triazole, 3-mercapto-1,2,4-triazole, chlorobenzotriazole, nitrobenzotriazole, aminobenzotriazole, cyclohexano[1,2-d]triazole, 4,5,6,7-tetrahydroxytolyltriazole, 1-hydroxybenzotriazole, ethylbenzotriazole, naphthotriazole, 1-N,N-bis(2-ethylhexyl)-[(1,2,4-triazol-1-yl)methyl] amine, 1-[N,N-bis(2-ethylhexyl)aminomethyl] benzotriazole, 1-[N,N-bis(2-ethylhexyl)aminomethyl] tolyltriazole, 1-[N,N-bis(2-ethylhexyl)aminomethyl] carboxybenzotriazole, 1-[N,N-bis(2-hydroxyethyl)-aminomethyl]benzotriazole, 1-[N,N-bis(2-hydroxyethyl)-aminomethyl]tolyltriazole, 1-[N,N-bis(2-hydroxyethyl)-aminomethyl]carboxybenzotriazole, 1-[N,N-bis(2-hydroxypropyl)aminomethyl]carboxybenzotriazole, 1-[N,N-bis(1-butyl)aminomethyl]carboxybenzotriazole, 1-[N,N-bis(1-octyl)aminomethyl]carboxybenzotriazole, 1-(2',3'-dihydroxypropyl)benzotriazole, 1-(2',3'-di-carboxyethyl) benzotriazole, 2-(2'-hydroxy-3',5'-di-tert-butylphenyl) benzotriazole, 2-(2'-hydroxy-3',5'-amylphenyl) benzotriazole, 2-(2'-hydroxy-4'-octoxyphenyl) benzotriazole, 2-(2'-hydroxy-5'-tert-butylphenyebenzotriazole, 1-hydroxybenzotriazole-6-carboxylic acid, 1-oleoylbenzotriazole, 1,2,4-triazol-3-ol, 5-amino-3-mercapto-1,2,4-triazole, 5-amino-1,2,4-triazole-3-carboxylic acid, 1,2,4-triazole-3-carboxyamide, 4-aminourazole, and 1,2,4-triazol-5-one. The content of this benzotriazole compound is not particularly limited but is an amount in a range from 0.01 ppm to 3% and preferably in a range from 0.1 ppm to 1% of the composition in terms of mass units.

The present composition is such that curing occurs either at room temperature or under heating, but it is preferable to heat the composition in order to achieve rapid curing. The heating temperature is preferably from 50 to 200° C.

The cured product of the present invention will now be described in detail.

The cured product of the present invention is formed by curing the curable silicone composition described above. The shape of the cured product is not particularly limited, and examples include a sheet shape and a film shape. The cured product can be handled as a simple substance or may also be handled in a state in which the cured product covers or seals an optical semiconductor element or the like.

The optical semiconductor device of the present invention will now be explained in detail.

The optical semiconductor device of the present invention is produced by sealing an optical semiconductor element with a cured product of the curable silicone composition described above. Examples of such an optical semiconductor device of the present invention include a light emitting diode (LED), a photocoupler, and a CCD. Examples of light emitting diodes (LEDs) include SMD (surface Mount Device) type and COB (Chip on Board) type. Examples of SMD include top-view type and side-view type. Examples of optical semiconductor elements include light emitting diode (LED) chips and solid-state image sensing devices. Examples of light emitting diode chips include face-up type and flip-chip type. Furthermore, examples of light emitting diode chips include Ga—As containing infrared LED chip, Ga—Al—As containing red LED chip, Ga—As—P containing orange or yellow LED chip, nitrogen-doped Ga—As containing yellow LED chip, and gallium nitride compound-containing blue or bluish-violet LED chip.

FIG. 1 illustrates a cross-sectional view of a single surface mounted type LED, which is one example of the optical semiconductor device of the present invention. In the LED illustrated in FIG. 1, an optical semiconductor element 1 is die-bonded to a lead frame 2, and the semiconductor element 1 and a lead frame 3 are wire-bonded by a bonding wire 4. A frame material 5 is provided around the periphery of this optical semiconductor element 1, and the optical semiconductor element 1 on the inner side of this frame material 5 is sealed by a cured product 6 of the curable silicone composition of the present invention. Examples of materials for the frame material include aromatic polyamide resin, aliphatic cyclic polyamide resin, aliphatic polyamide resin, liquid crystal polymer, silicone resin, modified silicone resin, epoxy resin, and modified epoxy resin.

An example of a method for producing the surface mounted type LED illustrated in FIG. 1 is a method comprising die-bonding the optical semiconductor element 1 to the lead frame 2, wire-bonding this optical semiconductor element 1 and the lead frame 3 by a metal bonding wire 4, charging the curable silicone composition of the present invention inside the frame material 5 provided around the periphery of the optical semiconductor element 1, and then curing the curable silicone composition by heating to 50 to 200° C.

EXAMPLES

The curable silicone composition, the cured product thereof, and the optical semiconductor device of the present invention will be described in detail hereinafter using Examples. In the Examples, viscosity is a value at 25° C., and Me, Vi, Ph, and Ep respectively represent a methyl group, a vinyl group, a phenyl group, and a 3-glycidoxypropyl group. The properties of the cured product of the curable silicone composition were measured as follows.

[Refractive Index of Cured Product]

A cured product was produced by heating the curable silicone composition at 150° C. for 2 hours in a circulating hot air oven. The refractive index of this cured product at 25° C. and at a wavelength of 633 nm was measured using a refractometer.

[Water Vapor Permeability of Cured Product]

A film-like cured product with a thickness of 1 mm was prepared by curing the curable silicone composition for 2 hours at 150° C. using a press. The water vapor permeability of the film-like cured product was measured using a water vapor permeation analyzer manufactured by Systech Illinois (model: 7002) under conditions with a temperature of 40° C. and 90% relative humidity. As a result of the measurement, the case where the water vapor permeation was from 10 g/m²·24 hr or greater to less than 15 g/m²·24 hr was indicated as "⊚", the case where the water vapor permeation was from 15 g/m²·24 hr or greater to less than 20 g/m²·24 hr was indicated as "○", and the case where the water vapor permeation was from 20 g/m²·24 hr or greater was indicated as "X".

[Elongation of Cured Product]

A sheet-like cured product with a thickness of 2 mm was prepared, and this was stamped out in the dumb-bell form of JIS No. 3 as stipulated in JIS K 6251-1993 "Tensile testing methods for vulcanized rubber". The elongation (%) at break was measured using an autograph made by Shimadzu Corporation. As a result of the measurement, the case where the elongation was 20% or greater was indicated as "⊚", the case where the elongation was from 10% or greater to less than 20% was indicated as "○", and the case where the elongation was less than 10% was indicated as "X".

[Sulfidation Resistance]

The optical semiconductor device illustrated in FIG. 1 was produced using the curable silicone composition. Note that the curable silicone composition was cured by heating at 150° C. for 2 hours. The initial radiant flux of this optical semiconductor device was measured by a device for measuring the total radiant flux using an integrating sphere. Then, this optical semiconductor device was placed in an autoclave in which sodium sulfide hexahydrate was placed, heated to 50° C., and left for 100 hours. Thereafter, the radiant flux was measured by a device for measuring the total radiant flux using an integrating sphere. The case where the rate of change was 20% or less was indicated as "⊚", and the case where the rate of change was from more than 20% to 30% or less was indicated as "○".

[Crack Resistance]

An optical semiconductor device of FIG. 1 was produced using the curable silicone composition. Note that the curable silicone composition was cured by heating at 150° C. for 2 hours. The obtained optical semiconductor device was aged while light was emitted under conditions at a temperature of 85° C., humidity of 85%, and applied electrical charges of 420 mA. After 500 hours, the appearance of the optical semiconductor device was observed using an electron microscope. The case where no cracks were observed was indicated as "⊚", and the case where cracks occurred was indicated as "X".

[Change of Total Radiant Flux]

The optical semiconductor device illustrated in FIG. 1 was produced using the curable silicone composition. Note that the curable silicone composition was cured by heating at 150° C. for 2 hours. The initial radiant flux of this optical semiconductor device was measured by a device for measuring the total radiant flux using an integrating sphere. Then, this optical semiconductor device was aged while light was emitted under conditions at a temperature of 85° C., humidity of 85%, and applied electrical charges of 400 mA.

After 1000 hours, the radiant flux of the optical semiconductor device was measured by a device for measuring the total radiant flux using an integrating sphere. The case where the rate of change was 5% or less was indicated as "⊚", the case where the rate of change was from more than 5% to 10% or less was indicated as "○", and the case where the rate of change was more than 10% was indicated as "Δ".

Reference Example 1

In a reaction vessel, 14.0 g (0.08 mol) of 1,3-divinyl-1,1,3,3-tetramethyldisiloxane, 137.3 g of toluene, 50.2 g of isopropyl alcohol, and 78.9 g of concentrated hydrochloric acid were placed, and a mixed solution of 59.5 g (0.30 mol) of phenyltrimethoxysilane, 74.9 g (0.55 mol) of methyltrimethoxysilane, and 65 g of toluene was added dropwise at 60° C. or lower. Following completion of the dropwise addition, the obtained mixture was stirred at 70° C. for 3 hours. Thereafter, generated methanol was distilled out, and the obtained mixture was washed to make the system neutral. Then, the solvent was removed under reduced pressure to obtain 57 g (yield: 40%) of an organopolysiloxane resin represented by the average unit formula:

$(Me_2ViSiO_{1/2})_{0.15}(PhSiO_{3/2})_{0.30}(MeSiO_{3/2})_{0.55}$ that was colorless and transparent and had a number average molecular weight of 1,400 and a refractive index of 1.49.

Reference Example 2

In a reaction vessel, 14.0 g (0.08 mol) of 1,3-divinyl-1,1,3,3-tetramethyldisiloxane, 137.3 g of toluene, 50.2 g of isopropyl alcohol, and 78.9 g of concentrated hydrochloric acid were placed, and a mixed solution of 39.7 g (0.20 mol) of phenyltrimethoxysilane, 88.5 g (0.65 mol) of methyltrimethoxysilane, and 65 g of toluene was added dropwise at 60° C. or lower. Following completion of the dropwise addition, the obtained mixture was stirred at 70° C. for 3 hours. Thereafter, generated methanol was distilled out, and the obtained mixture was washed to make the system neutral. Then, the solvent was removed under reduced pressure to obtain 57 g (yield: 40%) of an organopolysiloxane resin represented by the average unit formula:

$(Me_2ViSiO_{1/2})_{0.15}(PhSiO_{3/2})_{0.20}(MeSiO_{3/2})_{0.65}$ that was colorless and transparent and had a number average molecular weight of 1,450 and a refractive index of 1.48.

Reference Example 3

In a reaction vessel, 14.0 g (0.08 mol) of 1,3-divinyl-1,1,3,3-tetramethyldisiloxane, 137.3 g of toluene, 50.2 g of isopropyl alcohol, and 78.9 g of concentrated hydrochloric acid were placed, and a mixed solution of 23.8 g (0.12 mol) of phenyltrimethoxysilane, 99.4 g (0.73 mol) of methyltrimethoxysilane, and 65 g of toluene was added dropwise at 60° C. or lower. Following completion of the dropwise addition, the obtained mixture was stirred at 70° C. for 3 hours. Thereafter, generated methanol was distilled out, and the obtained mixture was washed to make the system neutral. Then, the solvent was removed under reduced pressure to obtain 57 g (yield: 40%) of an organopolysiloxane resin represented by the average unit formula:

$(Me_2ViSiO_{1/2})_{0.15}(PhSiO_{3/2})_{0.12}(MeSiO_{3/2})_{0.73}$ that was colorless and transparent and had a number average molecular weight of 1,385 and a refractive index of 1.46.

Reference Example 4

In a reaction vessel, 14.0 g (0.08 mol) of 1,3-divinyl-1,1,3,3-tetramethyldisiloxane, 137.3 g of toluene, 50.2 g of isopropyl alcohol, and 78.9 g of concentrated hydrochloric acid were placed, and a mixed solution of 9.92 g (0.05 mol) of phenyltrimethoxysilane, 109.0 g (0.80 mol) of methyltrimethoxysilane, and 65 g of toluene was added dropwise at 60° C. or lower. Following completion of the dropwise addition, the obtained mixture was stirred at 70° C. for 3 hours. Thereafter, generated methanol was distilled out, and the obtained mixture was washed to make the system neutral. Then, the solvent was removed under reduced pressure to obtain 57 g (yield: 40%) of an organopolysiloxane resin represented by the average unit formula:

$(Me_2ViSiO_{1/2})_{0.15}(PhSiO_{3/2})_{0.05}(MeSiO_{3/2})_{0.80}$ that was colorless and transparent and had a number average molecular weight of 1,724 and a refractive index of 1.44.

Reference Example 5

In a reaction vessel, 37.7 g (0.23 mol) of hexamethyldisiloxane, 65.0 g (0.35 mol) of 1,3-divinyl-1,1,3,3-tetramethyldisiloxane, and 0.42 g of trifluoromethane sulfonic acid were placed, and 187.4 g (10.4 mol) of ion-exchange water, 202.7 g (1.02 mol) of phenyltrimethoxysilane, and 335.4 g (2.45 mol) of methyltrimethoxysilane were added dropwise. Following completion of the dropwise addition, the obtained mixture was refluxed for 1 hour to remove low boiling point components. Then, 267 g of toluene and 0.8 g of potassium hydroxide were added to the obtained mixture, and an azeotrope was formed to remove water. Thereafter, the obtained mixture was stirred for 6 hours at 120° C. Thereafter, the obtained mixture was neutralized by acetic acid, and resulting salts were filtered out. Then, the solvent was removed under reduced pressure to obtain an organopolysiloxane resin represented by the average unit formula:

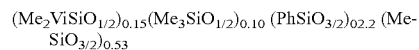
$(Me_2ViSiO_{1/2})_{0.15}(Me_3SiO_{1/2})_{0.10}(PhSiO_{3/2})_{02.2}(MeSiO_{3/2})_{0.53}$ that was colorless and transparent and had a number average molecular weight of 2,350 and a refractive index of 1.47.

Reference Example 6

In a reaction vessel, 280.0 g (1.41 mol) of phenyltrimethoxysilane, 192.3 g (1.41 mol) of methyltrimethoxysilane, 131.0 g (0.422 mol) of 1,3-divinyl-1,3-diphenyl-1,3-dimethyldisiloxane, and 4.87 g (32.5 mmol) of trifluoromethane sulfonic acid were placed, and 154.0 g (8.5 mol) of ion-exchange water was added dropwise. Following completion of the dropwise addition, the obtained mixture was refluxed for 2 hours to remove low boiling point components. Then, 272 g of toluene and 2.67 g (47.6 mmol) of potassium hydroxide were added to the obtained mixture, and an azeotrope was formed to remove water. Thereafter, the obtained mixture was stirred for 6 hours at 120° C. Thereafter, the obtained mixture was neutralized by 1.1 g (18 mmol) of acetic acid, and resulting salts were filtered out. Then, the solvent was removed under reduced pressure to obtain 396 g (yield: 96%) of an organopolysiloxane resin represented by the average unit formula:

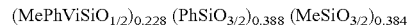
$(MePhViSiO_{1/2})_{0.228}(PhSiO_{3/2})_{0.388}(MeSiO_{3/2})_{0.384}$ that was colorless and transparent and had a number average molecular weight of 2,200 and a refractive index of 1.533.

Reference Example 7

In a reaction vessel, 200.0 g (1.01 mol) of phenyltrimethoxysilane, 58.5 g (0.43 mol) of methyltrimethoxysilane, 66.7 g (0.215 mol) of 1,3-divinyl-1,3-diphenyl-1,3-dimethyldisiloxane, and 1.24 g (8.3 mmol) of trifluoromethane sulfonic acid were placed, and 55.0 g (3 mol) of ion-exchange water was added dropwise. Following completion of the dropwise addition, the obtained mixture was refluxed for 2 hours to remove low boiling point components. Then, 56.5 g of toluene and 0.97 g (17.3 mmol) of potassium hydroxide were added to the obtained mixture, and an azeotrope was formed to remove water. Thereafter, the obtained mixture was stirred for 6 hours at 120° C. Thereafter, the obtained mixture was neutralized by 0.89 g (15 mmol) of acetic acid, and resulting salts were filtered out. Then, the solvent was removed under reduced pressure to obtain 218 g (yield: 97%) of an organopolysiloxane resin represented by the average unit formula:

$(MePhViSiO_{1/2})_{0.235}(PhSiO_{3/2})_{0.539}(MeSiO_{3/2})_{0.226}$ that was colorless and transparent and had a number average molecular weight of 1,700 and a refractive index of 1.545.

Reference Example 8

In a reaction vessel, 40.0 g (0.045 mol) of a dimethylpolysiloxane represented by the following formula:

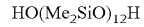
$HO(Me_2SiO)_{12}H$ 62.0 g of toluene and 10.9 g (0.107 mol) of triethylamine were placed, and 22.0 g (0.090 mol) of vinyldiphenylchlorosilane was added while stirring. After the obtained mixture was stirred for 1 hour at room temperature, the mixture was heated to 50° C. and stirred for 3 hours. Water was then added. After washing with water, low boiling point substances were removed from the organic phase by heating under reduced pressure to obtain an organopolysiloxane represented by the following formula:

$$Ph_2ViSiO(Me_2SiO)_{12}SiPh_2Vi$$

that was colorless and transparent and had a viscosity of 36 mPa·s and a refractive index of 1.466.

Reference Example 9

First, 82.2 g (0.44 mol) of 1,3-divinyl-1,1,3,3-tetramethyldisiloxane, 143 g of water, 0.38 g of trifluoromethane sulfonic acid, and 500 g of toluene were loaded into a 4-necked flask with a stirrer, a refluxing cooler, and a thermometer, and 524.7 g (2.65 mol) of phenyltrimethoxysilane was added dropwise into the mixture over the course of one hour while stirring. Following completion of the dropwise addition, the mixture was heat-refluxed for 1 hour. The mixture was then cooled, and after the bottom phase was separated, the toluene solution phase was washed with water three times. In the washed toluene solution phase, 314 g (1.42 mol) of 3-glycidoxypropyl methyldimethoxysilane, 130 g of water, and 0.50 g of potassium hydroxide were added and heat-refluxed for 1 hour. Methanol was then distilled off, and the excess water was removed by azeotropic dehydration. After heat-refluxing for 4 hours, the toluene solution was cooled, neutralized with 0.55 g of acetic acid, and washed three times with water. After the water was removed, the toluene was distilled off under reduced pressure to prepare an adhesion-imparting agent with a viscosity of 8,500 mPa·s represented by the average unit formula:

$$(Me_2ViSiO_{1/2})_{0.18}(PhSiO_{3/2})_{0.53}(EpMeSiO_{2/2})_{0.29}$$

Practical Examples 1 to 6 and Comparative Example 1

Curable silicone compositions were prepared using the components listed below according to the compositions (parts by mass) shown in Table 1. Note that, in Table 1, the content of component (D) is expressed in terms of the content (ppm, in terms of mass units) of platinum metal relative to the curable silicone composition. H/Vi in Table 1 represents the molar number of silicon atom bonded hydrogen atoms in component (C) relative to a total of one mol of vinyl groups in component (A) and in component (B).

The following components were used as component (A).
Component (A-1): organopolysiloxane resin prepared in Reference Example 1 and represented by the average unit formula:

$$(Me_2ViSiO_{1/2})_{0.15}(PhSiO_{3/2})_{0.30}(MeSiO_{3/2})_{0.55}$$

Component (A-2): organopolysiloxane resin prepared in Reference Example 2 and represented by the average unit formula:

$$(Me_2ViSiO_{1/2})_{0.15}(PhSiO_{3/2})_{0.20}(MeSiO_{3/2})_{0.65}$$

Component (A-3): organopolysiloxane resin prepared in Reference Example 3 and represented by the average unit formula:

$$(Me_2ViSiO_{1/2})_{0.15}(PhSiO_{3/2})_{0.12}(MeSiO_{3/2})_{0.73}$$

Component (A-4): organopolysiloxane resin prepared in Reference Example 4 and represented by the average unit formula:

$$(Me_2ViSiO_{1/2})_{0.15}(PhSiO_{3/2})_{0.05}(MeSiO_{3/2})_{0.80}$$

Component (A-5): organopolysiloxane resin prepared in Reference Example 5 and represented by the average unit formula:

$$(Me_2ViSiO_{1/2})_{0.15}(Me_3SiO_{1/2})_{0.10}(PhSiO_{3/2})_{022}(MeSiO_{3/2})_{0.53}$$

Component (A-6): organopolysiloxane resin having a number average molecular weight of 1,300 and a refractive index of 1.54, and represented by the average unit formula:

$$(Me_2ViSiO_{1/2})_{0.2}(PhSiO_{3/2})_{0.8}$$

Component (A-7): organopolysiloxane resin having a number average molecular weight of 1,100 and a refractive index of 1.54, and represented by the average unit formula:

$$(Me_2ViSiO_{1/2})_{0.25}(PhSiO_{3/2})_{0.75}$$

Component (A-8): organopolysiloxane resin prepared in Reference Example 6 and represented by the average unit formula:

$$(MePhViSiO_{1/2})_{0.228}(PhSiO_{3/2})_{0.388}(MeSiO_{3/2})_{0.384}$$

Component (A-9): organopolysiloxane resin prepared in Reference Example 7 and represented by the average unit formula:

$$(MePhViSiO_{1/2})_{0.235}(PhSiO_{3/2})_{0.539}(MeSiO_{3/2})_{0.226}$$

The following components were used as component (B).
Component (B-1): organopolysiloxane prepared in Reference Example 8 and represented by the formula:

$$Ph_2ViSiO(Me_2SiO)_{12}SiPh_2Vi$$

Component (B-2): methylphenylpolysiloxane capped at both molecular terminals with dimethylvinylsiloxy groups having a viscosity of 3,000 mPa·s and represented by the formula:

$$Me_2ViSiO(MePhSiO)_{25}SiMe_2Vi$$

The following components were used as component (C).
Component (C-1): organotrisiloxane having a viscosity of 4 mPa·s and represented by the formula:

$$HMe_2SiOPh_2SiOSiMe_2H$$

Component (C-2): silicone resin having a viscosity of 30 mPa·s and represented by the average unit formula:

$$(Me_2HSiO_{1/2})_{0.6}(PhSiO_{3/2})_{0.4}$$

The following component was used as component (D).
Component (D-1): solution of a platinum-1,3-divinyl-1,1,3,3-tetramethyldisiloxane complex in 1,3,5,7-tetramethyl-1,3,5,7-tetravinylcyclotetrasiloxane (the solution contains 0.1 mass % of platinum)

The following component was used as component (E).
Component (E-1): 1-ethynylcyclohexanol The following components were used as component (F).
Component (F-1): adhesion-imparting agent prepared in Reference Example 9
Component (F-2): adhesion-imparting agent which has a viscosity at 25° C. of 30 mPa·s and which contains a condensation reaction product of 3-glycidoxypropyltrimethoxysilane and a methylvinylsiloxane oligomer capped at both molecular terminals with silanol groups The following components were used as component (G).
Component (G-1): aluminate type green light-emitting fluorescent substances having an average particle diameter of 13 μm
Component (G-2): nitride type red light-emitting fluorescent substances having an average particle diameter of 15 μm

TABLE 1

| | Practical Example 1 | Practical Example 2 | Practical Example 3 | Practical Example 4 | Practical Example 5 | Practical Example 6 | Comp. Example 1 |
|---|---|---|---|---|---|---|---|
| Component (A-1) | 77.53 | — | — | — | — | — | — |
| Component (A-2) | — | 75.4 | — | — | 50.18 | — | — |
| Component (A-3) | — | — | 75.22 | — | — | — | — |
| Component (A-4) | — | — | — | 73.35 | — | — | — |
| Component (A-5) | — | — | — | — | — | 73.95 | — |
| Component (A-6) | — | — | — | — | — | — | 83.23 |
| Component (A-7) | — | — | — | — | 11.49 | — | — |
| Component (B-1) | 1.00 | 1.00 | 1.00 | 1.00 | 0.5 | 1.00 | 1.00 |
| Component (B-2) | — | — | — | — | 14.04 | — | — |
| Component (C-1) | 13.4 | 14.73 | 14.84 | 16.01 | 14.2 | 14.8 | 9.83 |
| Component (C-2) | 8.04 | 8.84 | 8.90 | 9.61 | 7.1 | 7.4 | 5.90 |
| Component (D-1) | 2.5 ppm | 2.5 ppm | 2.5 ppm | 2.5 ppm | 2.5 ppm | 2.5 ppm | 2.5 ppm |
| Component (E-1) | 0.03 | 0.03 | 0.03 | 0.03 | 0.03 | 0.03 | 0.03 |
| Component (F-1) | 2.5 | 2.5 | 2.5 | — | 2.5 | 2.5 | 2.5 |
| Component (F-2) | — | — | — | 2.5 | — | — | — |
| H/Vi | 1.0 | 1.0 | 1.0 | 1.0 | 1.0 | 1.0 | 1.0 |
| Refractive index | 1.49 | 1.48 | 1.47 | 1.46 | 1.49 | 1.47 | 1.55 |
| Elongation | ○ | ◎ | ◎ | ◎ | ◎ | ○ | X |
| Sulfidation resistance | ◎ | ◎ | ○ | ○ | ◎ | ○ | ◎ |
| Water vapor permeability | ◎ | ◎ | ○ | ○ | ◎ | ○ | ◎ |
| Crack resistance | ◎ | ◎ | ◎ | ◎ | ◎ | ◎ | X |

From the results shown in Table 1, it was confirmed that the curable silicone compositions prepared in Practical Examples 1 to 6 can suppress cracks and had superior elongation compared to the curable silicone composition prepared in Comparative Example 1.

Practical Examples 7, 8

Curable silicone compositions were prepared using the components listed above according to the compositions (parts by mass) shown in Table 2. Note that, in Table 2, the content of component (D) is expressed in terms of the content (ppm, in terms of mass units) of platinum metal relative to the curable silicone composition. H/Vi in Table 2 represents the molar number of silicon atom bonded hydrogen atoms in component (C) relative to a total of one mol of vinyl groups in component (A) and in component (B).

TABLE 2

| | Practical Example 7 | Practical Example 8 |
|---|---|---|
| Component (A-8) | 63.7 | — |
| Component (A-9) | — | 63.7 |
| Component (B-2) | 18.8 | 18.8 |
| Component (C-1) | 14.8 | 14.8 |
| Component (D-1) | 2.5 ppm | 2.5 ppm |
| Component (E-1) | 0.03 | 0.03 |
| Component (F-1) | 2.5 | 2.5 |
| Component (G-1) | 30.9 | 30.9 |
| Component (G-2) | 7.5 | 7.5 |
| H/Vi | 0.7 | 0.7 |
| Refractive index | 1.54 | 1.55 |
| Water vapor permeability | ◎ | ◎ |
| Crack resistance | ◎ | ◎ |
| Change of total radiant flux | ◎ | ◎ |

INDUSTRIAL APPLICABILITY

The curable silicone composition of the present invention can be used as an adhesive, a potting agent, a protective agent, a coating agent, or an underfill agent for electrical/electronic use. In particular, the curable silicone composition has high reactivity and can form a cured product with low gas permeability, so the composition is suitable as a protective coating material or a sealing agent for an optical semiconductor element in an optical semiconductor device such as a light emitting diode (LED), or the like.

DESCRIPTION OF SYMBOLS

1 Optical semiconductor element
2 Lead frame
3 Lead frame

4 Bonding wire
5 Frame material
6 Cured product of the curable silicone composition

The invention claimed is:
1. A curable silicone composition comprising:
(A) an organopolysiloxane represented by the average unit formula:

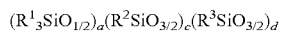

wherein, $R^1$ are the same or different alkyl groups having from 1 to 12 carbons, alkenyl groups having from 2 to 12 carbons, aryl groups having from 6 to 20 carbons, or aralkyl groups having from 7 to 20 carbons, provided that at least two $R^1$ in a molecule are the alkenyl groups; $R^2$ is an aryl group having from 6 to 20 carbons or an aralkyl group having from 7 to 20 carbons; $R^3$ is an alkyl group having from 1 to 12 carbons; and a, c, and d are respectively numbers satisfying: $0.01 \leq a \leq 0.5$, $0.01 \leq c < 0.7$, $0.1 \leq d < 0.9$, and $a+c+d=1$;
(B) a linear organopolysiloxane having at least two silicon-bonded alkenyl groups and at least one silicon-bonded aryl group in a molecule, in an amount of 0.1 to 150 parts by mass per 100 parts by mass of component (A);
(C) an organopolysiloxane having at least two silicon-bonded hydrogen atoms in a molecule, in an amount so that the amount of silicon-bonded hydrogen atoms in component (C) is from 0.1 to 5 mol per 1 mol of total alkenyl groups in components (A) and (B); and
(D) a hydrosilylation-reaction catalyst in an amount that accelerates curing of the present composition.

2. The curable silicone composition according to claim 1, wherein $R^2$ in component (A) is a phenyl group.
3. The curable silicone composition according to claim 1, wherein $R^3$ in component (A) is a methyl group.
4. The curable silicone composition according to claim 1, wherein component (B) is an organopolysiloxane represented by the general formula:

[Formula 1]

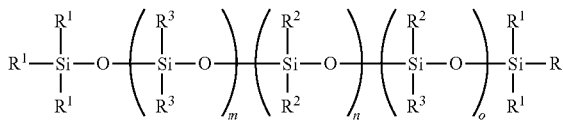

wherein, $R^1$ to $R^3$ are the same as the groups described above; m is an integer from 0 to 800, n is an integer from 0 to 300, and o is an integer from 0 to 300, provided that m, n, and o satisfy: $m \geq n$ and $5 \leq m+n+o \leq 1,000$.

5. The curable silicone composition according to claim 1, further comprising (E) a hydrosilylation-reaction inhibitor in an amount of 0.01 to 3 parts by mass per 100 parts total mass of components (A) to (C).
6. The curable silicone composition according to claim 1, further comprising (F) an adhesion promoter in an amount of 0.1 to 3 parts by mass per 100 parts total mass of components (A) to (C).
7. A cured product produced by curing the curable silicone composition described in claim 1.

8. An optical semiconductor device comprising an optical semiconductor element sealed with a cured product of the curable silicone composition described in claim 1.
9. The curable silicone composition according to claim 2, wherein $R^3$ in component (A) is a methyl group.
10. The curable silicone composition according to claim 9, wherein component (B) is an organopolysiloxane represented by the general formula:

[Formula 1]

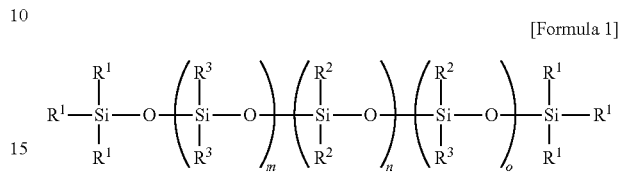

wherein, $R^1$ to $R^3$ are the same as the groups described above; m is an integer from 0 to 800, n is an integer from 0 to 300, and o is an integer from 0 to 300, provided that m, n, and o satisfy: $m \geq n$ and $5 \leq m+n+o \leq 1,000$.

11. The curable silicone composition according to claim 2, wherein component (B) is an organopolysiloxane represented by the general formula:

[Formula 1]

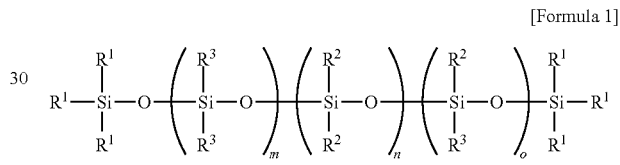

wherein, $R^1$ to $R^3$ are the same as the groups described above; m is an integer from 0 to 800, n is an integer from 0 to 300, and o is an integer from 0 to 300, provided that m, n, and o satisfy: $m \geq n$ and $5 \leq m+n+o \leq 1,000$.

12. The curable silicone composition according to claim 3, wherein component (B) is an organopolysiloxane represented by the general formula:

[Formula 1]

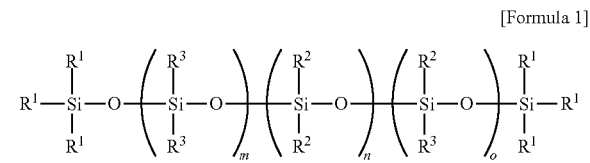

wherein, $R^1$ to $R^3$ are the same as the groups described above; m is an integer from 0 to 800, n is an integer from 0 to 300, and o is an integer from 0 to 300, provided that m, n, and o satisfy: $m \geq n$ and $5 \leq m+n+o \leq 1,000$.

13. The curable silicone composition according to claim 4, wherein $R^2$ in component (B) is a phenyl group and $R^3$ in component (B) is a methyl group.
14. The curable silicone composition according to claim 10, wherein $R^2$ in component (B) is a phenyl group and $R^3$ in component (B) is a methyl group.

* * * * *